United States Patent [19]

Bowling et al.

[11] Patent Number: 4,777,804
[45] Date of Patent: Oct. 18, 1988

[54] METHOD AND APPARATUS FOR EASING SURFACE PARTICLE REMOVAL BY SIZE INCREASE

[75] Inventors: Robert A. Bowling, Garland; Wayne G. Fisher, Allen; Edwin G. Millis, Dallas, all of Tex.

[73] Assignee: Texas Instruments Incorporated, Dallas, Tex.

[21] Appl. No.: 89,696

[22] Filed: Aug. 26, 1987

[51] Int. Cl.$^4$ ............................................. F25B 47/00
[52] U.S. Cl. ........................................ 62/85; 62/303; 134/25.4
[58] Field of Search .................... 62/303, 85; 134/153, 134/198, 25.1, 25.4

[56] References Cited

U.S. PATENT DOCUMENTS

| | | | |
|---|---|---|---|
| 3,611,744 | 10/1971 | Sutz | 62/303 |
| 4,027,686 | 6/1977 | Shortes | 134/153 |
| 4,129,919 | 12/1978 | Fitch | 15/302 |
| 4,138,306 | 2/1979 | Niwa | 156/345 |
| 4,322,252 | 3/1982 | Plumb | 134/25.4 |
| 4,589,926 | 5/1986 | Holmstrand | 134/25.4 |

Primary Examiner—Ronald C. Capossela
Attorney, Agent, or Firm—Rodney M. Anderson; Leo N. Heiting; Melvin Sharp

[57] ABSTRACT

A method and apparatus is provided for removing submicron sized particles from the surface of a silicon semiconductor wafer (38). Conventional cleaning methods are capable of only removing particles that are about 1 micron or larger in size. The present invention provides a way to increase the submicron particles in size so that they are removable by the known methods. The silicon semiconductor wafer (38) is cooled by a refrigeration unit (36) or by exposure to liquid nitrogen (74). The cooled wafer (38) is then exposed to a condensable material (42) which is allowed to condense on the surface of the wafer (38). The condensable material will surround any particles that are on the surface and cause them to grow in size due to the formation of frozen crystals. Without allowing the crystals to melt, the enlarged particles then are removed by any of the known methods.

27 Claims, 2 Drawing Sheets

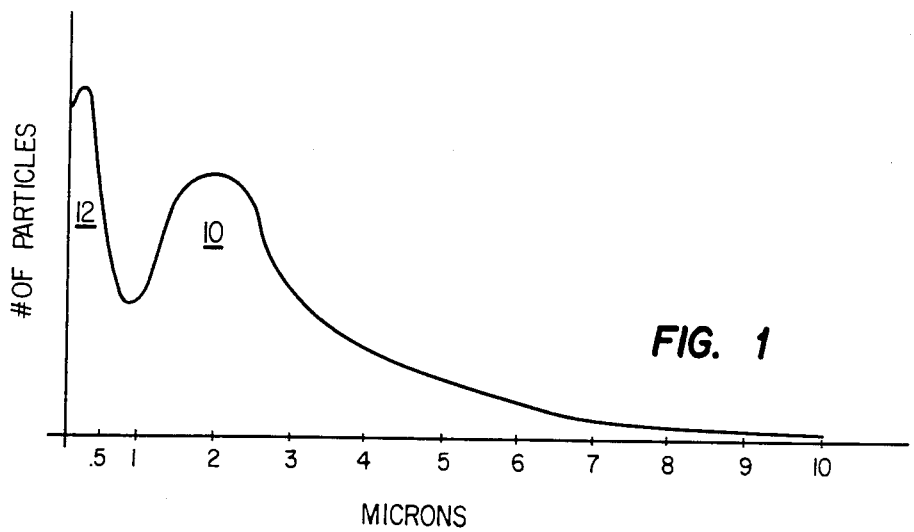
FIG. 1
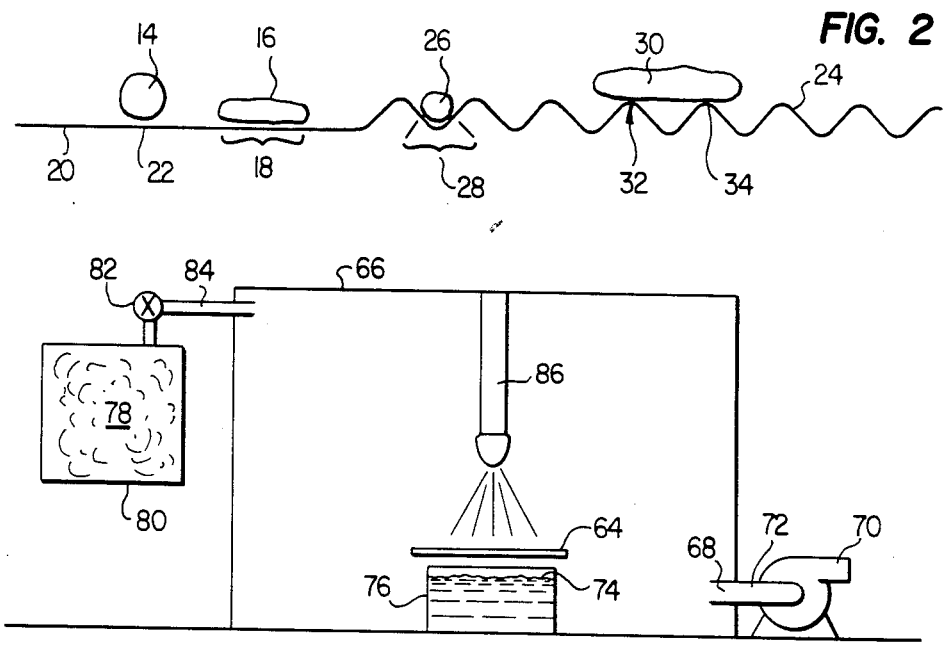
FIG. 2
FIG. 4

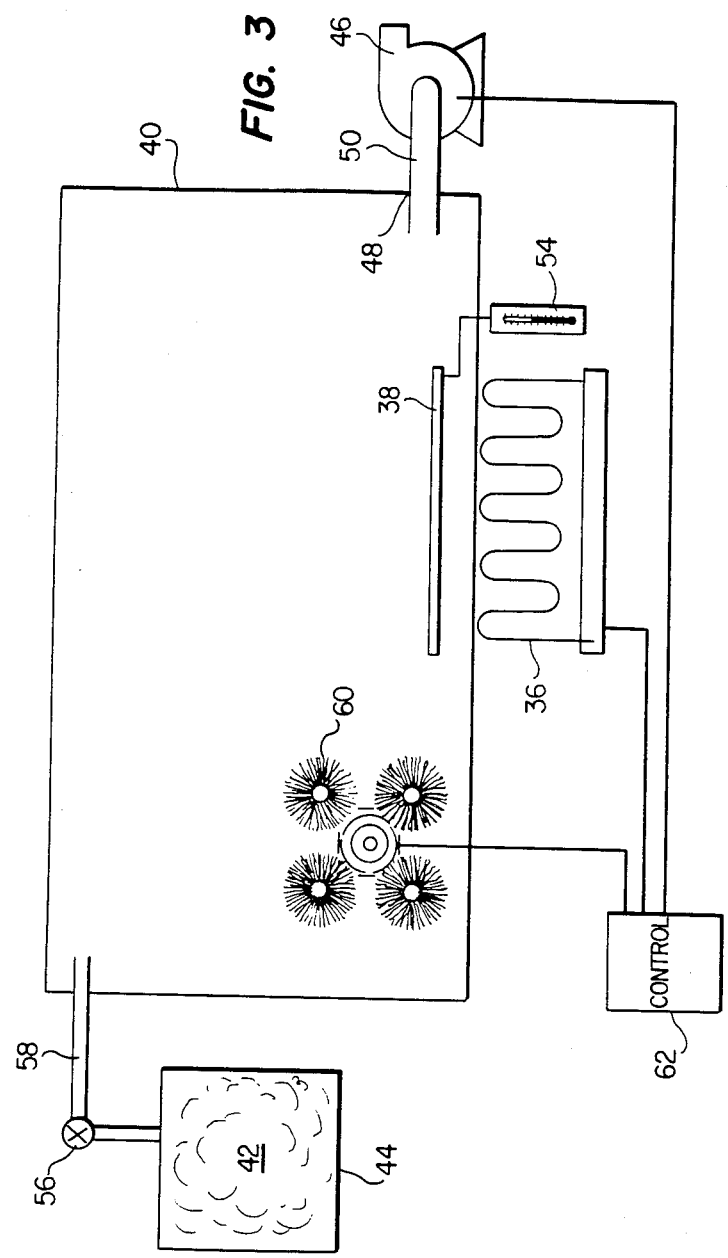

METHOD AND APPARATUS FOR EASING SURFACE PARTICLE REMOVAL BY SIZE INCREASE

TECHNICAL FIELD OF THE INVENTION

This invention relates in general to removal of small particles from surfaces and in particular, to the removal of small particles from the surface of a silicon semiconductor wafer.

BACKGROUND OF THE INVENTION

The manufacturing environment in which silicon semiconductor wafers are formed and further processed is inherently dirty. Attempts are made to keep the surrounding environment as clean as possible, but some particles always escape these attempts. Particles that may end up on the surface of a silicon semiconductor wafer include such things as silicon chips, silicon dioxide particles, organic particles (such as those shed by human beings including skin particles, dandruff, and etc.), and particles containing calcium, magnesium, chlorine, sulphur and etc. These particles have a tendency to interfere with the functioning of the semiconductor circuits being manufactured.

For example, if it is desired to form a thin film over a silicon wafer, and a particle of unwanted material is on the surface, the coating will be incomplete. If the purpose of the coating is to isolate one layer from another, the particle may serve as a hole or as a conductor to connect the two surfaces in an unwanted manner. Also if particles are present on the surface during an etching process, the surface under the particle will not be etched and, therefore, will create a short in the circuit. If the particle is in the size range of 10-20% of one of the feature sizes of the circuit, the particle is likely to be a problem. It is, therefore, necessary to remove unwanted particles by some additional method.

This becomes a problem as the size of the particles gets smaller and smaller. It is nearly impossible, using current technology, to remove a particle that is 0.1 of a micron or smaller in size. This is due to the fact that the adhesive forces on the particle are greater than the available area for which a removal force may be applied to the particle. Prior attempts to overcome such adhesive forces include different methods of applying a physical force to the particle, all of which have proven to be ineffective against very small particles.

One previously developed method of particle removal is to place the surface to be cleaned in a chemical bath and then use an ultrasonic or a megasonic sound agitating system. In this system, the ultrasonic or megasonic sound is induced into the liquid which shakes the chemical bath and attempts to remove any particles. This has been somewhat effective against relatively large particles, but ineffective against small particles.

Another cleaning method which has been previously used is to blast the surface to be cleaned with a fluid in order to blow or wash the particles from the surface. One such method utilizing water is disclosed in U.S. Pat. No. 4,027,686, June 7, 1977, to Shortes, et al. and assigned to Texas Instruments, Inc. Other fluids, including air, have been used with varying degrees of success. These methods have proven to be effective against large particles, but relatively ineffective against particles in the 0.1 micron or smaller range.

Another previously developed method involving application of force to the particle is to exploit the mass of the particle by the use of gravity or centrifugal force. These methods require the particle be of sufficient size to be pulled or thrown from the surface. When the particles are very small or have little mass the forces may not be high enough to remove them. Therefore, these methods are generally ineffective against submicron sized particles.

Still another line of previous attempts to remove particles is to convert them into nonparticles. This requires a knowledge of the chemistry of the particles, or a universal solvent (one that would dissolve all particles). This method uses a chemical specifically designed to attack and dissolve the particles but not the substrate they are on. It is necessary to know what the particles to be removed are and, therefore, the appropriate chemical. Since it is unlikely that the composition of all the particles will be known, it is difficult to remove all the particles with a chemical.

Another prior method to remove particles involves particle and surface interaction. This is an attempt to make the particle and the surface repel each other through the use of electricity. The problem encountered with this method is that a high electrical charge is required and, thus, it has been found to be undesirable.

One of the most common methods of particle removal involves using a brush scrubber. In this method, a brush is used to wipe the particles from the surface. It is necessary to compromise in the stiffness of the brush bristles, in that they must be stiff enough to remove the particles yet soft enough so as to not damage the surface. This method is effective against relatively large particles only.

A final method of removing particles has been an attempt to adhere the particles to a removable film. This method can be likened to the use of masking tape to remove lint from a jacket. A polymer gel or liquid is applied to the surface in an attempt to soak up all the particles. After the polymer has dried, and hopefully drawn the particles into it, the polymer is peeled off to remove the particles. This method, as with the other methods listed above, works only with relatively large particles.

Another handicap of these previously developed physical removal processes is the fact that they can damage the surface being cleaned as well as introduce other particles while trying to remove them.

Thus, a need has arisen for a method of removing very small particles from a semiconductor surface.

SUMMARY OF THE INVENTION

The present invention disclosed and claimed herein describes a method and apparatus for easing surface particle removal by increasing the effective size of the particle, which substantially eliminates problems associated with prior cleaning methods. The present invention removes submicron particles from the surface of a silicon semiconductor wafer.

In accordance with one aspect of this invention, the wafer is first cooled Cooling can either be by conventional refrigeration methods or a rapid cooling method. The conventional refrigeration method will necessarily require an atmosphere that is free of moisture. This is to prevent the premature condensation of stray water vapor in the atmosphere. This may be done, for example, by creating a vacuum within the refrigeration unit.

A condensable fluid, such as moist air or $CO_2$, is selected and isolated apart from the refrigeration unit.

The silicon wafer is placed in the refrigeration unit (which is then evacuated) until the temperature of the surface of the wafer is below the freezing point of the condensable fluid. The condensable fluid is then exposed to the wafer which causes condensation on the particles. The condensation of the fluid on the particles is similar to packing more snow around a snowball, i.e. the particle grows in size. The enlarged particle is now more susceptible to standard physical force particle removal equipment, such as scrubbers. Without allowing the wafer to warm up and thus melt the condensed fluid, the wafer is cleaned by any of the well known physical force methods.

A rapid cooling method, such as exposure to a liquid nitrogen bath, can be used to cool the wafer. In this method the rapid cooling is done in the presence of the condensable fluid. The cooling is done so quickly that the fluid goes directly from a gas to a solid, forming crystals on the particles. These enlarged particles are then removed using any of the well known physical force methods.

It is a technical advantage of the present invention to be able to remove submicron particles from a surface without introducing additional liquids to the surface. It is another technical advantage to facilitate submicron particle removal without further damage to the surface.

BRIEF DESCRIPTION OF THE DRAWINGS

For a more complete understanding of the present invention and for further advantages thereof, reference is now made to the following Detailed Description taken in conjunction with the accompanying Drawings in which:

FIG. 1 is graph of the number of particles by size;

FIG. 2 is a diagrammatic illustration of various typical particles and surface irregularities on a semiconductor wafer;

FIG. 3 is a side perspective view of one embodiment of the present invention; and FIG. 4 is an alternate embodiment of the present invention.

DETAILED DESCRIPTION OF THE INVENTION

FIG. 1 depicts a graph in which the vertical axis represents the number of particles in a typical semiconductor processing chamber and the horizontal axis represents the size of particles in microns. In the 1-3 micron area, there is a cluster of particles 10 that generally are found on semiconductor surfaces. These particles 10 are large enough to be removed by the known methods and are, therefore, of less concern. Another large group of particles 12 can be seen in the 0.01 to 0.5 micron range. It is the particles 12 in the 0.1-0.5 micron range which are particularly difficult to remove in typical semiconductor processing environments and are the target of this invention.

Particles larger than approximately ten microns are typically large enough to fall out of the atmosphere rather quickly and are generally not of concern. Particles much smaller than 0.01 micron will tend to conglomerate or adhere to one another and form larger particles which then fall into the 0.1 to 0.5 micron size range.

Particles adhere to a surface by a force known as Van der Waals Forces. These forces arise from the spontaneous polarization in the surface and in the particles. The amount of Van der Waals Force depends upon the materials involved. For example, a method that may remove a silicon particle from a surface might not be able to remove an organic particle.

Van der Waals Forces also vary as the size, shape and hardness of the particle varies. These factors are illustrated in FIG. 2. A hard spherical particle 14 will not be adhered as much as a soft elongated particle 16. This is due to the fact that the soft elongated particle 16 will have more contact area 18 near the surface 20 to which it is adhered than the hard particle 14. The hard particle 14 can be seen to have a much smaller contact area 22.

Also, the shape of the surface to which a particle is adhered effects the amount of Van der Waals Forces. If the surface is nearly flat as surface 20, a particle 14 may only have a limited contact area 22. However, if a wavy surface 24 is present, a hard spherical particle 26 may have a greater contact area 28. Conversely, a soft elongated particle 30 may have small contact areas 32 and 34 on irregular surfaces.

An important aspect of the present invention is to increase the effective size of the submicron particles on the surface sufficiently so that the adhesion forces may be overcome by known physical force methods.

Referring to FIG. 3, a system according to one embodiment of the present invention includes a refrigeration unit 36 utilized to cool a silicon wafer 38 disposed in a vacuum chamber 40. A condensable fluid 42, such as, for example, moist air or carbon dioxide, is selected and stored, for example, in a container 44. As used herein, a condensable fluid is defined as a fluid that will go from a gaseous state to a solid state with an imperceptable period of time as a liquid.

It is necessary to remove any unwanted condensable fluids from the chamber 40. A vacuum pump 46 is connected to the chamber 40 by an outlet 48 and tubing 50. After placing the wafer 38 in the chamber 40, the chamber 40 is evacuated, thus removing any unwanted condensable fluids such as any water vapor in the air.

The refrigeration unit 36 is activated to cool the wafer 38. The wafer 38 must be cooled until its temperature is below the freezing point of the condensable fluid 42. Once the temperature is determined to be low enough, such as by a thermometer 54, the condensable fluid 42 is allowed to enter the chamber 40. A valve 56 on the container 44 is opened and the condensable fluid 42 is drawn through a connecting pipe 58 into the chamber 40 due to the vacuum in chamber 40.

As the condensable fluid 42 contacts the cold silicon wafer 38, it will condense and form crystals on any particles lying on the wafer 38. The particles will "grow" in size due to the crystals that form on them. The amount of condensation and, thus, the amount of the growth of the particles can be adjusted by varying the length of time the wafer 38 is exposed to the condensable fluid 42.

After the desired growth of the particles has been achieved, the wafer 38 is cleaned by any known physical force device, such as, for example, a scrubber 60. The scrubber 60 is of a type that is well known in the art. Cleaning by the scrubber 60 is done before allowing the temperature of the wafer 38 to rise above the melting point of the condensable fluid 42. The scrubber 60 will now be able to remove the submicron particles because they have been increased in size by the condensable fluid 42. A control box 62 may be used to electrically control the refrigeration unit 36, the vacuum pump 46, and the scrubber 60.

An alternate method and apparatus is depicted in FIG. 4. A silicon semiconductor wafer 64 is placed in a chamber 66. The chamber 66 may be provided with an outlet 68 for drawing a vacuum. A vacuum pump 70 is connected to the chamber 66 and outlet 68 by tubing 72.

Liquid nitrogen 74 is placed in the chamber 66, for example, in a tub 76. The wafer 64 is exposed to the liquid nitrogen 74, causing the temperature of the wafer 64 to drop rapidly.

At the same time or shortly after exposure to the liquid nitrogen 74, a condensable fluid 78 is introduced to the chamber 66. The condensable fluid 78 is passed from a storage container 80, through a valve 82 into the chamber 66. The chamber 66 is connected to the valve 62 by a tube 84. The condensable fluid 78 can be, for example, moist air or carbon dioxide.

As the condensable fluid 78 enters the chamber 66, it condenses, thus forming crystals on any particles on the surface of the wafer 64. Again, the particles may be allowed to grow as much as needed for subsequent removal. Particle growth depends upon how long the wafer 64 is exposed to the condensable fluid 78.

Without allowing the wafer 64 to warm up and thus melt the condensed crystals, the wafer 64 is cleaned by any known physical force device, such as an air blaster 86. The air blaster 86 is of a type well known in the art. Air blaster 86 is connected to a pressurized air tank or other source of high pressure air (not shown).

Since cooling of the wafer 64 is so rapid, it may not be necessary in some instances to evacuate the chamber 66. However, by providing the vacuum pump 70, evacuation may be done if so desired.

An alternative to the use of liquid nitrogen 74 is the passing of a very cold gas over the wafer 64 prior to the introduction of the condensable fluid 78. Some possible gasses are, for example, nitrogen and helium. These gasses could be introduced into the chamber 66 by any appropriate manner, for example, by the container 80 and the valve 82, or the air blaster 86.

It is a technical advantage of the present invention to be able to increase the size of the particles without adding any liquids to the surface of the wafer 38 or 64. This is important since liquids may contain contaminating particles themselves. Therefore, it will often be preferable to use any of the cleaning methods that do not use a liquid, such as a scrubbing device or a gas blasting device.

It is another technical advantage of the present invention that it will not damage the surface of the wafer 38 or 64. It is, therefore, possible to use this method as many times as needed throughout various stages of the processing of the semiconductor wafer.

Although the present invention has been described with respect to a specific preferred embodiment thereof, various changes and modifications may be suggested to one skilled in the art and it is intended that the present invention encompass such changes and modifications as fall within the scope of the appended claims.

What is claimed is:

1. Apparatus for removing small particles from a surface, comprising:
   means for cooling said surface;
   means for exposing said surface to a condensable material such that the particles increase in size due to the condensation of said condensable material thereon; and
   means for removing said increased size particles from said surface.

2. The apparatus for removing particles from a surface of claim 1, wherein said condensable material comprises water vapor.

3. The apparatus for removing particles from a surface of claim 1, wherein said condensable material comprises carbon dioxide.

4. The apparatus for removing particles from a surface of claim 1, wherein said means for removing said increased size particles comprises a pressurized fluid injection system.

5. The apparatus for removing particles from a surface of claim 4, wherein said pressurized fluid comprises water.

6. The apparatus for removing particles from a surface of claim 4, wherein said pressurized fluid comprises carbon dioxide.

7. The apparatus for removing particles from a surface of claim 4, wherein said pressurized fluid comprises air.

8. The apparatus for removing particles from a surface of claim 1, wherein said means for removing said increased size particles comprises a brush scrubber.

9. The apparatus for removing particles from a surface of claim 1, wherein said means for removing said increased size particles comprises a sonic sound wave chemical bath.

10. The apparatus for removing particles from a surface of claim 1, wherein said means for cooling said surface includes structure for rapidly cooling said surface by exposure to liquid nitrogen.

11. The apparatus for removing particles from a surface of claim 1, wherein said means for cooling said surface includes a refrigeration unit.

12. The apparatus of claim 1, wherein said surface comprises a semiconductor surface and further comprising:
   a housing for enclosing said semiconductor surface, said means for cooling and said means for cleaning.

13. Apparatus for increasing the size of particles on a semiconductor surface so that the particles may be removed, comprising:
   means for cooling said semiconductor surface below the freezing point of a condensable fluid so that said condensable fluid will condense on said particles to cause them to increase in size; and
   means for removing said increased size particles from said surface before said particles decrease in size.

14. The apparatus for increasing the size of particles on a semiconductor surface of claim 13, wherein said means for removing comprises a pressurized fluid injection system.

15. The apparatus for increasing the size of particles on a semiconductor surface of claim 13, wherein said means for removing comprises a brush scrubber.

16. The apparatus for increasing the size of particles on a semiconductor surface of claim 13, wherein said means for cooling comprises:
   a housing for containing said semiconductor surface and said means for removing;
   means for injecting said condensable fluid into said housing; and
   a structure for the exposure of said surface to liquid nitrogen.

17. The apparatus for increasing the size of particles on a semiconductor surface of claim 13, wherein said means for cooling comprises:
   a container for enclosing said semiconductor surface and said means for removing;

means for injecting said condensable fluid into said container; and a refrigeration unit.

18. Apparatus for increasing the size of submicron particles on the surface of a silicon semiconductor wafer so that the particles may be removed, comprising:

a chamber for receiving said wafer;

means for cooling said wafer in said chamber;

means for exposing said cooled wafer to a condensable material so that said condensable material freezes on said submicron particles to cause them to increase in size; and means within said chamber for removing said increased size particles from said wafer before said frozen material melts.

19. A method for removing particles from a surface, comprising the steps of:

cooling said surface;

exposing said surface to a condensable material;

condensing said condensable material on said particles to increase the size of said particles; and applying a force to remove said increased size particles from said surface.

20. The method for removing particles from a surface of claim 19, wherein said surface comprises a semiconductor surace.

21. The method for removing particles from a surface of claim 19, wherein the step of condensing said condensable material on said particles comprises condensing water vapor on said particles.

22. The method for removing particles from a surface of claim 19, wherein the step of condensing said condensable material on said particles comprises condensing carbon dioxide on said particles.

23. The method for removing particles from a surface of claim 19, wherein the step of applying a force comprises applying pressurized fluid.

24. The method for removing particles from a surface of claim 19, wherein the step of applying a force comprises using a brush scrubber.

25. The method for removing particles from a surface of claim 19, wherein the step of applying a force comprises using a sonic sound wave chemical bath.

26. The method for removing particles from a surface of claim 19, wherein the step of cooling said surface comprises exposing said surface to liquid nitrogen.

27. The method for removing particles from a surface of claim 19, wherein the step of cooling said surface comprises exposing said surface to a refrigeration unit.

* * * * *